United States Patent [19]

Zhou et al.

[11] Patent Number: 5,863,307
[45] Date of Patent: Jan. 26, 1999

[54] METHOD AND SLURRY COMPOSITION FOR CHEMICAL-MECHANICAL POLISH (CMP) PLANARIZING OF COPPER CONTAINING CONDUCTOR LAYERS

[75] Inventors: Mei Sheng Zhou; Ron-Fu Chu, both of Singapore, Singapore

[73] Assignee: Chartered Semiconductor Manufacturing, Ltd., Singapore, Singapore

[21] Appl. No.: 80,804

[22] Filed: May 18, 1998

Related U.S. Application Data

[62] Division of Ser. No. 630,112, Apr. 8, 1996, Pat. No. 5,780,358.

[51] Int. Cl.$^6$ .................................................. B24D 3/34
[52] U.S. Cl. .............................. 51/307; 51/308; 51/309; 252/79.1; 438/693
[58] Field of Search .............................. 51/306, 30–39; 252/79.1; 438/693

[56] References Cited

U.S. PATENT DOCUMENTS

| | | | |
|---|---|---|---|
| 5,225,034 | 7/1993 | Yu et al. | 156/636 |
| 5,318,927 | 6/1994 | Sandhu et al. | 437/225 |
| 5,378,309 | 1/1995 | Rabinzohn | 156/643 |
| 5,780,358 | 7/1998 | Zhou et al. | 438/645 |

OTHER PUBLICATIONS

Hui–Qing et al. "Copper Metal Oxidation by a Dimethyl sulforide–carbon Tetrachloride Mixture", Proceedings, Science Research Congress 1992. Singapore, pp. 81–86..

*Primary Examiner*—Deborah Jones
*Attorney, Agent, or Firm*—George O. Saile; Stephen B. Ackerman

[57] ABSTRACT

A Chemical-Mechanical Polish (CMP) planarizing method and a Chemical-Mechanical Polish (CMP) slurry composition for Chemical-Mechanical Polish (CMP) planarizing of copper metal and copper metal alloy layers within integrated circuits. There is first provided a semiconductor substrate having formed upon its surface a patterned substrate layer. Formed within and upon the patterned substrate layer is a blanket copper metal layer or a blanket copper metal alloy layer. The blanket copper metal layer or blanket copper metal alloy layer is then planarized through a Chemical-Mechanical Polish (CMP) planarizing method employing a Chemical-Mechanical Polish (CMP) slurry composition. The Chemical-Mechanical Polish (CMP) slurry composition comprises a non-aqueous coordinating solvent and a halogen radical producing specie.

8 Claims, 4 Drawing Sheets

METHOD AND SLURRY COMPOSITION FOR CHEMICAL-MECHANICAL POLISH (CMP) PLANARIZING OF COPPER CONTAINING CONDUCTOR LAYERS

This is a division of patent application Ser. No. 08/630,112, filing date Apr. 8, 1996, now U.S. Pat. No. 5,780,358, Method And Slurry Composition For Chemical-Mechanical Polish (CMP) Planarizing Of Copper Containing Conductor Layers, assigned to the same assignee as the present invention.

BACKGROUND OF THE INVENTION

1. Field of the Invention

The present invention relates generally to Chemical-Mechanical Polish (CMP) planarizing of layers within integrated circuits. More particularly, the present invention relates to methods and slurry compositions for Chemical-Mechanical Polish (CMP) planarizing of copper metal and copper metal alloy conductor layers within integrated circuits.

2. Description of the Related Art

As dimensions of integrated circuit devices within advanced integrated circuits have continued to decrease, so also have the dimensions of conductor and interconnection elements which connect and interconnect those integrated circuit devices. In particular, dimensions of conductor and interconnection elements which directly contact integrated circuit devices have typically decreased the greatest, thus becoming the smallest in dimension of conductor and interconnection elements within advanced integrated circuits.

These most narrow conductor and interconnection elements typically comprise the first conductor or interconnection level which contacts an integrated circuit device. Most commonly, first conductor levels have been traditionally formed from aluminum metal or aluminum metal alloys. Most commonly, first interconnection levels (ie: first conductive contact studs) are formed of tungsten.

As integrated circuit device dimensions have decreased while simultaneously maintaining or increasing demands for performance of integrated circuits, it has become increasingly important for conductor and interconnection elements within integrated circuits to exhibit a high level of conductivity while simultaneously showing limited susceptibility to degradative phenomenon such as electromigration. Electromigration is the physical movement of portions of conductor and interconnect elements which occurs under conditions of high current density. Under extremely high current densities, electromigration may yield the complete movement of a portion of a conductor or interconnect element, resulting in an electrical open. Electromigration is most common in aluminum metal and aluminum metal alloy conductor and interconnect elements. Although electromigration is not typically observed in interconnects formed of tungsten, the conductivity of tungsten interconnects is typically substantially lower than the conductivity of aluminum metal or aluminum metal alloy interconnects.

In order to simultaneously provide the desired high electrical conductivity and low electromigration susceptibility of conductor and interconnection elements within advanced integrated circuits, there has recently been proposed for use within advanced integrated circuits conductor elements and interconnection elements formed of copper metal or copper metal alloys. While copper metal and copper metal alloys possess the high electrical conductivity and low electromigration susceptibility desired for conductor elements and interconnection elements within advanced integrated circuits, methods through which copper metal and copper metal alloys may be formed into conductor and interconnect elements within advanced integrated circuits are unfortunately neither entirely well developed nor entirely well understood. In particular, methods through which copper metal and copper metal alloys may be planarized through a Chemical-Mechanical Polish (CMP) planarizing method have received little development. It is thus in general towards the goal of forming within advanced integrated circuits conductor elements and interconnect elements formed of copper metal and copper metal alloys through a Chemical-Mechanical Polish (CMP) planarizing method that the present invention is directed.

Although methods for Chemical-Mechanical Polish (CMP) planarizing of blanket layers of copper metal and copper metal alloys within advanced integrated circuits may be neither well developed nor well understood, neither are such methods completely absent from the art. For example, Yu et al., in U.S. Pat. No. 5,225,034 disclose an aqueous abrasive slurry containing nitric acid, sulfuric acid or silver nitrate for use in Chemical-Mechanical Polish (CMP) planarizing of predominantly copper containing metal layers within advanced integrated circuits. Also disclosed by Yu et al. are additional oxidants which may be incorporated into the aqueous abrasive slurry.

In addition, Sandhu et al., in U.S. Pat. No. 5,318,927 disclose various slurries and polishing methods for removing insulating inorganic metal oxides such as perovskites from semiconductor substrates. The disclosed slurries are alternatively formed of: (1) aqueous acidic or basic compositions; (2) aqueous oxidant compositions; (3) non-aqueous liquid halogenated or pseudohalogenated compositions; or (4) organic ligand precursor compositions.

Although specifically related directly to neither Chemical-Mechanical Polish (CMP) planarizing methods nor to copper metal layers within integrated circuits, there is also disclosed in the art by Rabinzohn in U.S. Pat. No. 5,378,309 a novel method for controlling the slopes of etched layers within integrated circuits.

Finally, there is disclosed by Hui-Qing et al., in "Copper Metal Oxidation by a Dimethylsulfoxide-Carbon Tetrachloride Mixture," Proceedings, Science Research Congress 1992, Singapore, pp. 81–86, a rapid dissolution of copper metal under extremely mild conditions in a mixture of Di-Methyl-Sulf-Oxide (DMSO) and carbon tetrachloride (CC14). The teachings of Hui-Qing et al., are incorporated herein fully by reference.

Desirable in the art are additional Chemical-Mechanical Polish (CMP) planarizing methods and additional Chemical-Mechanical Polish (CMP) slurry compositions through which conductor and interconnect elements of copper metal or copper metal alloys may be formed within advanced integrated circuits. Particularly desirable are additional Chemical-Mechanical Polish (CMP) planarizing methods and additional Chemical-Mechanical Polish (CMP) slurry compositions which do not employ corrosive acids or bases.

SUMMARY OF THE INVENTION

A first object of the present invention is to provide a Chemical-Mechanical Polish (CMP) planarizing method and a Chemical-Mechanical Polish (CMP) slurry composition for forming within advanced integrated circuits conductor elements and interconnect elements formed of copper metal and copper metal alloys.

A second object of the present invention is to provide a Chemical-Mechanical Polish (CMP) planarizing method and a Chemical-Mechanical Polish (CMP) slurry composition in accord with the first object of the present invention, neither of which Chemical-Mechanical Polish (CMP) planarizing method or Chemical-Mechanical Polish (CMP) slurry composition employs corrosive acids or bases.

A third object of the present invention is to provide a Chemical-Mechanical Polish (CMP) planarizing method and a Chemical-Mechanical Polish (CMP) slurry composition in accord with the first object of the present invention and the second object of the present invention, which Chemical-Mechanical Polish (CMP) planarizing method and Chemical-Mechanical Polish (CMP) slurry composition are readily manufacturable.

In accord with the objects of the present invention there is provided a Chemical-Mechanical Polish (CMP) planarizing method and a Chemical-Mechanical Polish (CMP) slurry composition for forming within advanced integrated circuits planarized conductor and interconnect elements formed of copper metal and copper metal alloys. To practice the method of the present invention, there is first provided a semiconductor substrate. Formed upon the semiconductor substrate is a patterned substrate layer. Formed into and upon the patterned substrate layer is a blanket copper containing layer. The blanket copper containing layer is then planarized through a Chemical-Mechanical Polish (CMP) planarizing method. The Chemical-Mechanical Polish (CMP) planarizing method employs a Chemical-Mechanical Polish (CMP) slurry composition comprising a non-aqueous coordinating solvent and a halogen radical producing specie.

Provided by the present invention is a Chemical-Mechanical Polish (CMP) planarizing method and a Chemical-Mechanical Polish (CMP) slurry composition which may be employed in forming within advanced integrated circuits conductor and interconnect elements formed of copper metal and copper metal alloys. Although the intricate mechanism by which a halogen radical in conjunction with a non-aqueous coordinating solvent assists in Chemical-Mechanical Polish (CMP) planarizing a copper metal layer or copper metal alloy layer is not well understood, it is nonetheless clear that the simultaneous presence of a halogen radical and a non-aqueous coordinating solvent within a Chemical-Mechanical Polish (CMP) slurry composition will assist in efficiently planarizing copper metal layers and copper metal alloy layers through a Chemical-Mechanical Polish (CMP) planarizing method of the present invention.

Neither the Chemical-Mechanical Polish (CMP) planarizing method of the present invention nor the Chemical-Mechanical Polish (CMP) slurry composition of the present invention employs corrosive acids or bases. The Chemical-Mechanical Polish (CMP) planarizing method of the present invention and the Chemical-Mechanical Polish (CMP) slurry composition of the present invention employ a non-aqueous coordinating solvent and a halogen radical producing specie. Neither the non-aqueous coordinating solvent nor the halogen radical producing specie are typically substantially acidic or basic, nor are the non-aqueous coordinating solvent and the halogen radical producing specie substantially corrosive.

The present invention provides a Chemical-Mechanical Polish (CMP) planarizing method and a Chemical-Mechanical Polish (CMP) slurry composition which are readily manufacturable. The present invention provides a Chemical-Mechanical Polish (CMP) slurry composition which may be employed in Chemical-Mechanical Polish (CMP) processing equipment otherwise conventional in the art of integrated circuit manufacture. In addition, the Chemical-Mechanical Polish (CMP) slurry composition of the present invention is formed of materials which are readily available. Thus, the Chemical-Mechanical Polish (CMP) planarizing method of the present invention and the Chemical-Mechanical Polish (CMP) slurry composition of the present invention are readily manufacturable.

BRIEF DESCRIPTION OF THE DRAWINGS

The objects, features and advantages of the present invention are understood within the context of the description set forth below. The description is understood in conjunction with the accompanying drawings, which form a material part of this disclosure, wherein.

DESCRIPTION OF THE PREFERRED EMBODIMENT

Figure 1:
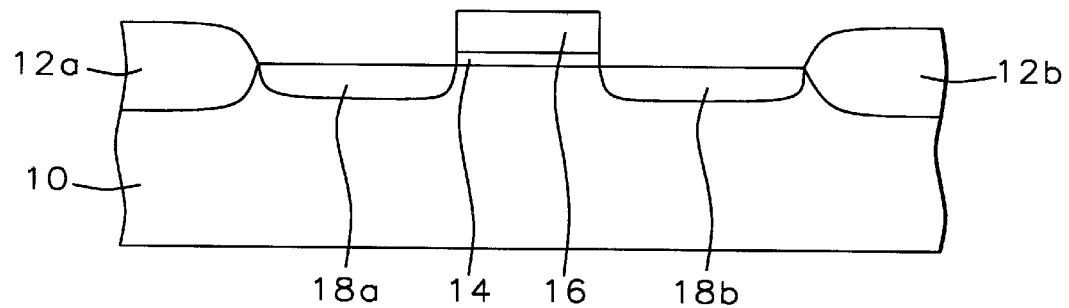
FIG. 1 to FIG. 6 show a series of schematic cross-sectional diagrams illustrating progressive stages in forming planarized copper metal or copper metal alloy layers within an integrated circuit through the Chemical-Mechanical Polish (CMP) planarizing method and Chemical-Mechanical Polish (CMP) slurry composition of the preferred embodiment of the present invention.

The present invention provides a Chemical-Mechanical Polish (CMP) planarizing method and a Chemical-Mechanical Polish (CMP) slurry composition, which Chemical-Mechanical Polish (CMP) planarizing method and Chemical-Mechanical Polish (CMP) slurry composition may be employed in planarizing copper metal layers and copper metal alloy layers within integrated circuits. The Chemical-Mechanical Polish (CMP) slurry composition is comprised of a non-aqueous coordinating solvent and a halogen radical producing specie. Although the intricate mechanism by which the Chemical-Mechanical Polish (CMP) planarizing method and the Chemical-Mechanical Polish (CMP) slurry composition of the present invention provide for efficient Chemical-Mechanical Polish (CMP) planarizing of copper metal layers and copper metal alloy layers within integrated circuits is not entirely well understood, it is nonetheless clear that the non-aqueous coordinating solvent and the halogen radical producing specie employed within the Chemical-Mechanical Polish (CMP) slurry composition and the Chemical-Mechanical Polish (CMP) planarizing method of the present invention assist in efficiently dissolving copper metal layers and copper metal alloy layers.

The Chemical-Mechanical Polish (CMP) planarizing method and the Chemical-Mechanical Polish (CMP) slurry composition of the present invention may be employed in planarizing copper metal layers and copper metal alloy layers within various types of integrated circuits. The Chemical-Mechanical Polish (CMP) planarizing method and the Chemical-Mechanical Polish (CMP) slurry composition of the present invention may be employed in planarizing copper metal layers and copper metal alloy layers within integrated circuits including but not limited to Dynamic Random Access Memory (DRAM) integrated circuits, Static Random Access Memory (SRAM) integrated circuits, Application Specific Integrated Circuits (ASICS), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors.

In addition to the various types of integrated circuits within which may be planarized copper metal layers or copper metal alloy layers, the Chemical-Mechanical Polish (CMP) planarizing method and the Chemical-Mechanical Polish (CMP) slurry composition of the present invention may also be employed in planarizing copper metal layers or copper alloy metal layers to form conductor elements and interconnect elements within various locations within integrated circuits. The Chemical-Mechanical Polish (CMP) planarizing method and the Chemical-Mechanical Polish (CMP) slurry composition of the present invention may be employed in planarizing copper metal layers and copper alloy metal layers from which are formed first copper containing conductive contact studs, second copper containing conductive contact studs, successive copper containing conductive contact studs, first copper containing conductor layers, second copper containing conductor layers and successive copper containing conductor layers within integrated circuits. First conductive contact studs typically directly contact electrodes of integrated circuit devices. In the absence of first conductive contact studs, first conductor layers alternatively typically directly contact the electrodes of integrated circuit devices.

Referring now to FIG. 1 to FIG. 6 there is show a series of schematic cross-sectional diagrams illustrating progressive stages in forming several Chemical-Mechanical Polish (CMP) planarized copper metal or copper metal alloy layers within an integrated circuit through the Chemical-Mechanical Polish (CMP) planarizing method and the Chemical-Mechanical Polish (CMP) slurry composition of the preferred embodiment of the present invention. Shown in FIG. 1 is a schematic cross-sectional diagram of the integrated circuit at its early stages of fabrication.

Shown in FIG. 1 is a semiconductor substrate 10 upon and within whose surface there are formed isolation regions 12a and 12b. Semiconductor substrates upon which the present invention may be practiced may be formed with either dopant polarity, any dopant concentration and any crystallographic orientation. Typically, the semiconductor substrate 10 upon which is practiced the present invention is a N- or P- silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate mask is oxidized to form isolation regions within and upon the semiconductor substrate, and methods whereby a separate insulating layer is independently formed upon a semiconductor substrate and subsequently patterned to form isolation regions upon the semiconductor substrate. For the preferred embodiment of the present invention, the isolation regions 12a and 12b are preferably formed through a thermal oxidation process whereby portions of the semiconductor substrate 10 exposed through an oxidation mask are consumed to form within and upon the semiconductor substrate 10 isolation regions 12a and 12b of silicon oxide.

Also illustrated within FIG. 1 is a gate oxide layer 14 upon which resides a gate electrode 16. Both the gate oxide layer 14 and the gate electrode 16 reside upon the active semiconductor region of the semiconductor substrate 10. Both the gate oxide layer 14 and the gate electrode 16 are components of a Field Effect Transistor (FET).

Methods and materials through which gate oxide layers and gate electrodes may be formed upon active semiconductor regions of semiconductor substrates are known in the art. Gate oxide layers may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region of a semiconductor substrate. Excess portions of blanket gate oxide layers formed upon active semiconductor regions of semiconductor substrates may optionally be removed through etching processes conventional to the art.

Gate electrodes are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the preferred embodiment of the present invention, the gate oxide layer 14 is preferably formed through patterning of a blanket gate oxide layer formed through thermal oxidation of the active semiconductor region of semiconductor substrate 10 at a temperature of about 800 to about 1000 degrees centigrade to yield a typical blanket gate oxide layer thickness of about 40 to about 150 angstroms. For the preferred embodiment of the present invention, the gate electrode 16 is preferably formed by patterning and etching a blanket polycide (highly doped polysilicon/metal silicide) layer or blanket metal silicide layer formed upon the blanket gate oxide layer at a thickness of about 2000 to about 4000 angstroms through a Chemical Vapor Deposition (CVD) process employing silane as the silicon source material, along with suitable dopant species, as appropriate. Once the blanket polycide layer or blanket metal silicide layer has been patterned to yield the gate electrode 16, the gate electrode 16 may optionally be used as an etch mask to pattern the gate oxide layer 14 from the blanket gate oxide layer.

Finally, there is shown in FIG. 1 source/drain electrodes 18a and 18b formed within the surface of the active semiconductor region of the semiconductor substrate 10 at areas not occupied by the gate electrode 16, the gate oxide layer 14 and the isolation regions 12a and 12b. Methods and materials through which source/drain electrodes may be formed within semiconductor substrates are known in the art. Such methods typically employ dopant species which are ionized and implanted into a semiconductor substrate at sufficient velocity and dose to form into the semiconductor substrate a region of conductivity sufficient for a source/drain electrode. The polarity desired for the source/drain electrode will dictate the polarity of the dopant species. Arsenic dopant species, boron dopant species and phosphorus dopant species are common in the art. For the preferred embodiment of the present invention, the source/drain electrodes 18a and 18b are preferably formed through implanting a suitable dopant species into the active region of the semiconductor substrate 10 at about 1E14 to about 1E16 ions per square centimeter dose and about 30 to about 100 keV ion implantation energy.

Having formed a Field Effect Transistor (FET) structure comprising source/drain electrodes 18a and 18b formed into the semiconductor substrate 10, and a gate electrode 16 upon a gate oxide layer 14 adjoining the source/drain electrodes 18a and 18b, the next series of process steps in forming within an integrated circuit copper metal layers or copper metal alloy layers planarized through the Chemical-Mechanical Polish (CMP) planarizing method and Chemical Mechanical-Polish (CMP) slurry composition of the present invention may proceed. A schematic cross-sectional diagram of an integrated circuit illustrating the results of those process steps is shown in FIG. 2.

Figure 2:
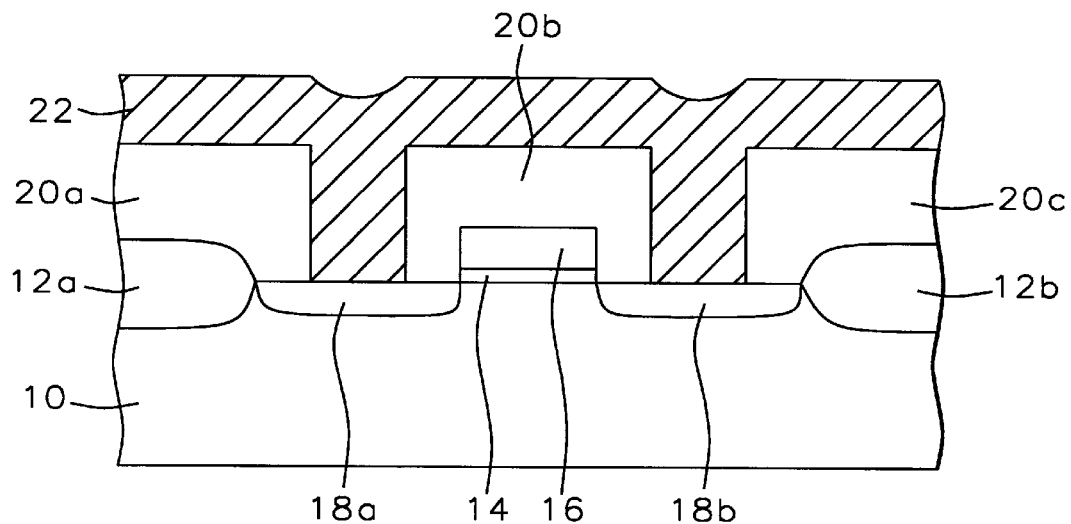

Shown in FIG. 2 is the presence of patterned Pre-Metal Dielectric (PMD) layers 20a, 20b and 20c which are formed upon the surface of the integrated circuit whose structure is illustrated in FIG. 1. Methods and materials through which patterned Pre-Metal Dielectric (PMD) layers may be formed within integrated circuits are known in the art. Patterned Pre-Metal Dielectric layers are typically, although not exclusively, formed through patterning through methods as are conventional in the art of blanket Pre-Metal Dielectric layers. The patterning may be accomplished through photolithographic and etch methods as are conventional in the art, including but not limited to wet chemical etch methods and Reactive Ion Etch (RIE) etch methods. The blanket Pre-Metal Dielectric layers may be formed through methods and materials including but not limited to Chemical Vapor Deposition (CVD) methods, Plasma Enhanced Chemical Vapor Deposition (PECVD) methods and Physical Vapor Deposition (PVD) sputtering methods through which may be formed blanket Pre-Metal Dielectric layers of dielectric materials including but not limited to silicon oxide dielectric materials, silicon nitride dielectric materials and silicon oxynitride dielectric materials.

For the preferred embodiment of the present invention, the patterned Pre-Metal Dielectric (PMD) layers 20a, 20b and 20c are preferably formed through patterning via a Reactive Ion Etch (RIE) etch method as is common in the art of a blanket Pre-Metal Dielectric (PMD) layer formed of a silicon oxide deposited through a Plasma Enhanced Chemical Vapor Deposition (PECVD) method, as is also common in the art. Preferably, the thicknesses of the patterned Pre-Metal Dielectric (PMD) layers 20a, 20b and 20c are from about 3000 to about 10000 angstroms each.

Also shown in FIG. 2 is the presence of a blanket first copper containing conductor layer 22. The blanket first copper containing conductor layer 22 may be formed of copper metal or a copper metal alloy. Preferably, the blanket first copper containing conductor layer 22 contains at least about 80 percent copper. Preferably, the thickness of the blanket first copper containing conductor layer 22 is from about 3000 to about 10000 angstroms. As is understood by a person skilled in the art, the blanket first copper containing conductor layer 22 may be formed within and upon the patterned Pre-Metal Dielectric (PMD) layers 20a, 20b and 20c through deposition methods conventional to the art, including but not limited to thermally assisted deposition methods, electron beam assisted deposition methods, Physical Vapor Deposition (PVD) sputtering methods and Chemical Vapor Deposition (CVD) methods.

Figure 3:
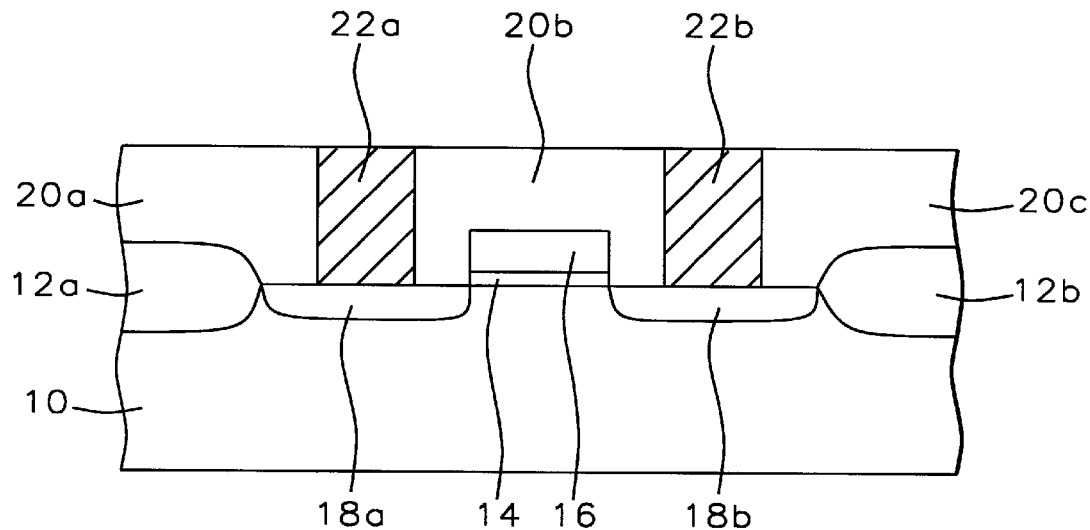

Referring now to FIG. 3, there is shown a schematic cross-sectional diagram illustrating the results of further processing of the integrated circuit whose structure is illustrated in FIG. 2. Shown in FIG. 3 is the results of planarizing the blanket first copper containing conductor layer 22 illustrated in FIG. 2 to form the first copper containing conductive contact studs 22a and 22b. The planarizing is accomplished employing the Chemical-Mechanical Polish (CMP) planarizing method of the present invention and the Chemical-Mechanical Polish (CMP) slurry composition of the present invention.

The Chemical-Mechanical Polish (CMP) slurry composition of the present invention comprises a non-aqueous coordinating solvent and a halogen radical producing specie. This combination of components has been shown to assist in the rapid dissolution of copper metal under mild conditions. See, for example, Hui-Qing et al., "Copper Metal Oxidation by a Dimethylsulfoxide-Carbon Tetrachloride Mixture," Proceedings, Science Research Congress 1992, Singapore, pp. 81–86, the teachings of which are incorporated herein fully by reference.

There are several options for non-aqueous coordinating solvents which may be employed in the Chemical-Mechanical Polish (CMP) slurry composition of the present invention. Non-aqueous coordinating solvents may be mono-coordinate or poly-coordinate. In addition, the coordinating atoms within the non-aqueous coordinating solvent may include, but are not limited to, oxygen coordinating atoms, nitrogen coordinating atoms and sulfur coordinating atoms. Preferably, the non-aqueous coordinating solvent within the Chemical-Mechanical Polish (CMP) slurry composition of the present invention is chosen from the group of non-aqueous coordinating solvents consisting of acetonitrile (CH3CN), Tetra-Hydro-Furan (THF) and Di-Methyl-Sulf-Oxide (DMSO). Most preferably, the non-aqueous coordinating solvent within the Chemical-Mechanical Polish (CMP) slurry composition of the present invention is Di-Methyl-Sulf-Oxide (DMSO).

Various halogen containing species which may produce halogen radicals within the non-aqueous coordinating solvent of the Chemical-Mechanical Polish (CMP) slurry composition of the present invention are known in the art. Typical halogen containing species which may produce halogen radicals within the non-aqueous coordinating solvent include but are not limited to C1–C2 perchloro, hydrochloro, perbromo and hydrobromo compounds. Preferably the halogen radical producing specie of the present invention is a chlorine radical producing specie chosen from the group of chlorine radical producing species consisting of C1–C2 perchloro and hydrochloro compounds. Most preferably, the halogen radical producing specie is the chlorine radical producing specie carbon tetrachloride (CCl4). Most preferably, the Chemical-Mechanical Polish (CMP) slurry composition of the present invention is formed with Di-Methyl-Sulf-oxide (DMSO) as the non-aqueous coordinating solvent and carbon tetrachloride (CCl4) as the halogen radical producing specie, at a DMSO:CCl4 volume ratio of from about 10:1 to about 0.1:1.

In addition to the non-aqueous coordinating solvent and the halogen radical producing specie, the Chemical-Mechanical Polish (CMP) slurry composition of the present invention also preferably has contained therein an abrasive powder, at a concentration of from about 1 to about 20 percent by weight of the total weight of the Chemical-Mechanical Polish (CMP) slurry composition. Abrasive powders which may be incorporated into the Chemical-Mechanical Polish (CMP) slurry composition of the present invention include but are not limited to alumina abrasive powders, silica abrasive powders and titania abrasive powders.

In addition to the non-aqueous coordinating solvent, the halogen radical producing specie and the abrasive powder, various other components may optionally be included within the Chemical-Mechanical Polish (CMP) slurry composition of the present invention. These components include but are not limited to surfactants, leveling agents, aqueous and non-aqueous co-solvents, anti-oxidants, viscosity modifiers, fillers and the like as are known in the art to impart other desirable properties to the Chemical-Mechanical Polish (CMP) slurry composition of the present invention.

The Chemical-Mechanical Polish (CMP) slurry composition of the present invention may be employed in planarizing the blanket first copper containing conductor layer 22 to the first conductive contact studs 22a and 22b through the use of Chemical-Mechanical Polish (CMP) processing equipment conventional to the art. A typical and preferred, although not exclusive, Chemical-Mechanical Polish (CMP) planarizing method for planarizing the first copper containing conductive contact studs 22a and 22b from the blanket first copper containing conductor layer 22 includes an IC1000/SUBA4 polishing pad, a polishing pad pressure of from about 1 to about 20 pounds per square inch (psi) and a rotation speed of about 20 to about 150 revolutions per minute (rpm). Other polishing pads, polishing pad pressures and rotation speeds may, however, be employed.

Figure 4:
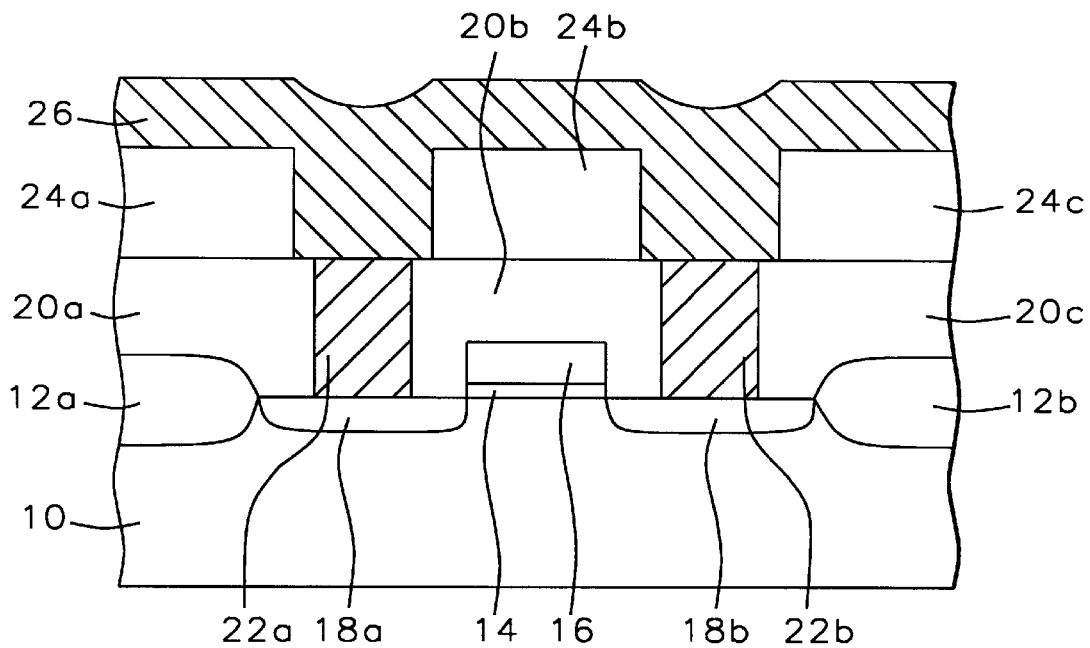

Referring now to FIG. 4 there is shown a schematic cross-sectional diagram illustrating the results of further processing of the integrated circuit whose structure is illustrated in FIG. 3. Shown in FIG. 4 are the patterned first Inter-Metal Dielectric (IMD) layers 24a, 24b and 24c within and upon which is formed the blanket second copper containing conductor layer 26. The patterned first Inter-Metal Dielectric layers 24a, 24b and 24c are preferably formed through methods, materials and dimensions equivalent to the methods, materials and dimensions through which are formed the patterned Pre-Metal Dielectric layers 20a, 20b, and 20c. The blanket second copper containing conductor layer 26 is preferably formed through methods, materials and dimensions equivalent to the methods, materials and dimensions through which is formed the blanket first copper containing conductor layer 22.

Figure 5:
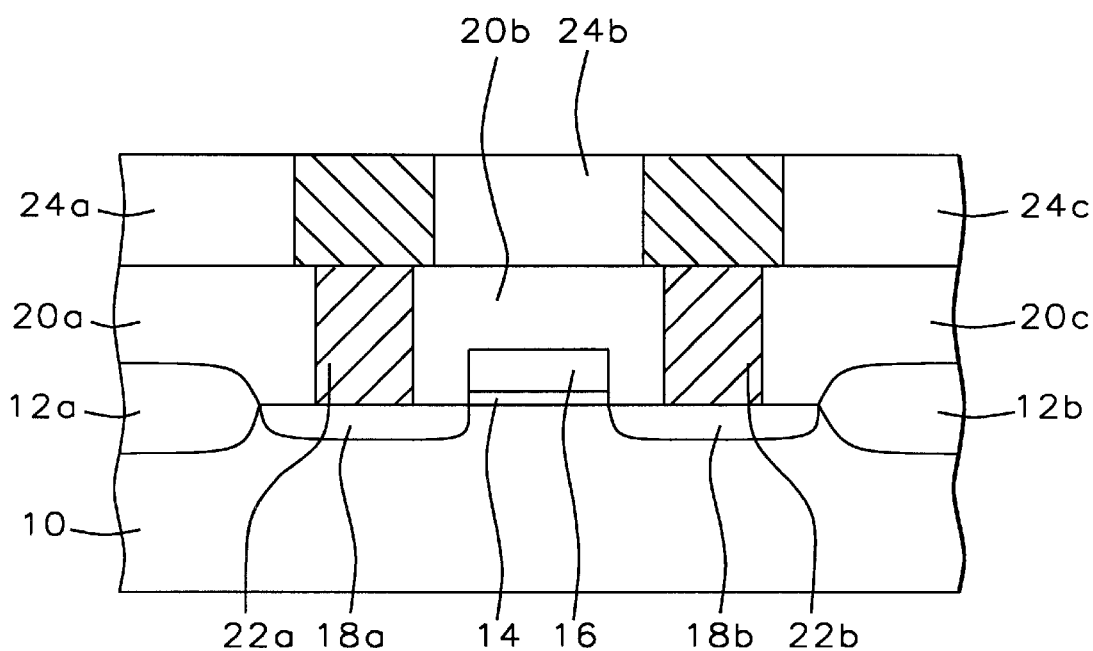

Referring now to FIG. 5, there is shown the results of further processing of the integrated circuit whose structure is illustrated in FIG. 4. Shown in FIG. 5 is the results of planarizing the blanket second copper containing conductor layer 26, as illustrated in FIG. 4, to form the patterned first copper containing conductor layers 26a and 26b. The planarizing of the blanket second copper containing conductor layer 26 to form the patterned first copper containing conductor layers 26a and 26b is undertaken through the Chemical-Mechanical Polish (CMP) planarizing method and the Chemical-Mechanical Polish (CMP) slurry composition of the preferred embodiment of the present invention, as disclosed above with reference to FIG. 3, wherein the blanket first copper containing conductor layer 22 is Chemical-Mechanical Polish (CMP) planarized to yield the first copper containing conductive contact studs 22a and 22b.

As is understood by a person skilled in the art, additional patterned Inter-Metal Dielectric (IMD) layers, additional copper containing conductive contact studs and additional patterned copper containing conductor layers may be formed upon the surface of the integrated circuit whose schematic cross-sectional diagram is illustrated in FIG. 5. A schematic cross-sectional diagram of an integrated circuit illustrating the results of such additional layering is shown in FIG. 6.

Figure 6:
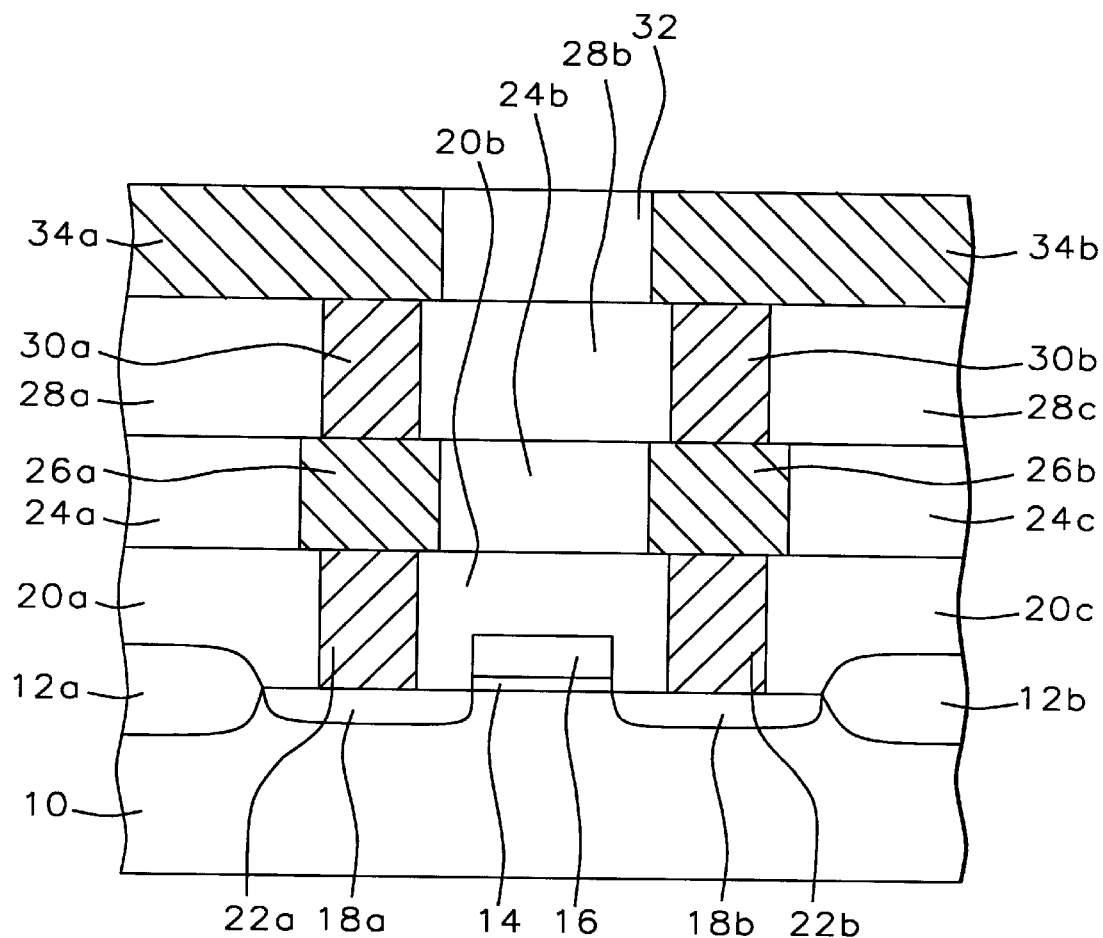

Shown in FIG. 6 is a schematic cross-sectional diagram of the integrated circuit whose schematic cross-sectional diagram is illustrated in FIG. 5, upon whose surface is formed: (1) the patterned second Inter-Metal Dielectric (IMD) layers 28a, 28b and 28c; (2) the second copper containing conductive contact studs 30a and 30b; (3) the patterned third Inter-Metal Dielectric (IMD) layer 32; and (4) the patterned second copper containing conductor layers 34a and 34b. The patterned second Inter-Metal Dielectric (IMD) layers 28a, 28b and 28c, and the patterned third Inter-Metal Dielectric layer 32 are formed through methods, materials and dimensions equivalent to the methods, materials and dimensions through which are formed the patterned first Inter-Metal Dielectric (IMD) layers 24a, 24b and 24c. The second copper containing conductive contact studs 30a and 30b are formed through methods, materials and dimensions equivalent to the methods, materials and dimensions through which are formed the first copper containing conductive contact studs 22a and 22b. Finally, the patterned second copper containing conductor layers 34a and 34b are formed through methods, materials and dimensions equivalent to the methods, materials and dimensions through which are formed the patterned first copper containing conductor layers 26a and 26b.

Upon forming the patterned second copper containing conductor layers 34a and 34b, there is formed the integrated circuit of the preferred embodiment of the present invention. The integrated circuit of the preferred embodiment of the present invention has formed therein multiple copper containing conductive contact studs and multiple patterned copper containing conductor layers. The multiple copper containing conductive contact studs and multiple patterned copper containing conductor layers are formed through planarizing blanket copper containing conductor layers through the Chemical-Mechanical Polish (CMP) planarizing method and the Chemical-Mechanical Polish (CMP) slurry composition of the present invention.

As is understood by a person skilled in the art, the preferred embodiment of Chemical-Mechanical Polish (CMP) planarizing method of the present invention and the preferred embodiment of the Chemical-Mechanical Polish (CMP) slurry composition of the present invention are representative of the present invention rather than limiting of the present invention. Revisions may be made to methods, materials, structures and dimensions through and upon which is practiced the Chemical-Mechanical Polish (cmp) planarizing method of the present invention and the Chemical-Mechanical Polish (CMP) slurry composition of the present invention while still providing Chemical-Mechanical Polish (CMP) planarizing methods and Chemical-Mechanical Polish (CMP) slurry compositions within the spirit and scope of the present invention.

What is claimed is:

1. A Chemical-Mechanical Polish (CMP) slurry composition for planarizing a copper containing layer comprising:
    a halogen radical producing specie;
    a non-aqueous coordinating solvent; and, optionally, an abrasive powder.

2. The Chemical-Mechanical Polish (CMP) slurry composition of claim 1 wherein the halogen radical producing specie is a chlorine radical producing specie.

3. The Chemical-Mechanical Polish (CMP) slurry composition of claim 2 wherein the chlorine radical producing specie is chosen from the group of chlorine radical producing species consisting of C1–C2 perchloro and hydrochloro chlorine radical producing species.

4. The Chemical-Mechanical Polish (CMP) slurry composition of claim 2 wherein the chlorine radical contributing specie is carbon tetrachloride (CCl4).

5. The Chemical-Mechanical Polish (CMP) slurry composition of claim 1 wherein the non-aqueous coordinating solvent is chosen from the group of non-aqueous coordinating solvents consisting of acetonitrile (CH3CN), Tetra-Hydro-Furan (THF) and Di-Methyl-Sulf-Oxide (DMSO).

6. The Chemical-Mechanical Polish (CMP) slurry composition of claim 1 wherein the non-aqueous coordinating solvent is Di-Methyl-Sulf-Oxide (DMSO).

7. The Chemical-Mechanical Polish (CMP) slurry composition of claim 1 wherein the non-aqueous coordinating solvent is Di-Methyl-Sulf-Oxide (DMSO) and the halogen radical producing specie is carbon tetrachloride (CCl4) at a DMSO:CCl4 volume ratio of from about 10:1 to about 0.1:1.

8. The Chemical-Mechanical Polish (CMP) slurry composition of claim 1 wherein the abrasive powder is selected from the group of abrasive powders consisting of alumina abrasive powders, silica abrasive powders and titania abrasive powders.

* * * * *